United States Patent
Sabathil et al.

(10) Patent No.: US 9,373,766 B2
(45) Date of Patent: Jun. 21, 2016

(54) OPTOELECTRONIC SEMICONDUCTOR COMPONENT

(71) Applicant: OSRAM Opto Semiconductors GmbH, Regensburg (DE)

(72) Inventors: Matthias Sabathil, Regensburg (DE); Stefan Illek, Donaustauf (DE); Thomas Schwarz, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/414,803

(22) PCT Filed: Jul. 16, 2013

(86) PCT No.: PCT/EP2013/064974
§ 371 (c)(1),
(2) Date: Jan. 14, 2015

(87) PCT Pub. No.: WO2014/016164
PCT Pub. Date: Jan. 30, 2014

(65) Prior Publication Data
US 2015/0194583 A1    Jul. 9, 2015

(30) Foreign Application Priority Data

Jul. 24, 2012    (DE) .......................... 10 2012 212 963

(51) Int. Cl.
| | |
|---|---|
| *H01L 33/54* | (2010.01) |
| *H01L 33/60* | (2010.01) |
| *H01L 31/00* | (2006.01) |
| *H01L 31/0232* | (2014.01) |
| *H01L 51/52* | (2006.01) |
| *H01L 25/075* | (2006.01) |
| *H01L 33/48* | (2010.01) |
| *H01L 33/56* | (2010.01) |
| *H01L 33/46* | (2010.01) |

(52) U.S. Cl.
CPC ............ *H01L 33/60* (2013.01); *H01L 25/0753* (2013.01); *H01L 31/00* (2013.01); *H01L 31/02322* (2013.01); *H01L 33/486* (2013.01); *H01L 33/54* (2013.01); *H01L 33/56* (2013.01); *H01L 51/5271* (2013.01); *H01L 33/46* (2013.01); *H01L 2924/0002* (2013.01); *H01L 2933/005* (2013.01); *H01L 2933/0033* (2013.01); *H01L 2933/0058* (2013.01)

(58) Field of Classification Search
CPC ..... H01L 33/54; H01L 33/60; H01L 51/5271; H01L 31/00; H01L 31/02322
See application file for complete search history.

(56) References Cited

U.S. PATENT DOCUMENTS

| | | |
|---|---|---|
| 2005/0156184 A1 | 7/2005 | Shen |
| 2006/0097291 A1 | 5/2006 | Takahashi et al. |

(Continued)

FOREIGN PATENT DOCUMENTS

| | | |
|---|---|---|
| DE | 10 208 011 153 | 5/2009 |
| DE | 10 2009 036 621 | 2/2011 |
| EP | 2 107 620 | 10/2009 |

OTHER PUBLICATIONS

German Search Report dated Dec. 18, 2012 from corresponding German Application No. 10 2012 212 963.4.

*Primary Examiner* — Phat X Cao
(74) *Attorney, Agent, or Firm* — DLA Piper LLP (US)

(57) ABSTRACT

An optoelectronic semiconductor component includes an optoelectronic semiconductor chip having a first surface. The semiconductor chip is embedded in a mold body. The first surface is elevated with respect to a top side of the mold body. A reflective layer is arranged on the top side of the mold body.

7 Claims, 5 Drawing Sheets

(56) References Cited

U.S. PATENT DOCUMENTS

| | | | |
|---|---|---|---|
| 2011/0049545 A1 | 3/2011 | Basin et al. | |
| 2011/0175117 A1* | 7/2011 | Jagt | H01L 33/44 257/88 |
| 2012/0193665 A1* | 8/2012 | Yamada | H01L 33/46 257/98 |
| 2013/0187179 A1* | 7/2013 | Tan | H01L 33/54 257/98 |
| 2013/0285087 A1* | 10/2013 | Wang | H01L 33/505 257/98 |

\* cited by examiner

OPTOELECTRONIC SEMICONDUCTOR COMPONENT

TECHNICAL FIELD

This disclosure relates to an optoelectronic semiconductor component and a method of producing an optoelectronic semiconductor component.

BACKGROUND

DE 10 2009 036 621 A1 discloses a method of producing an optoelectronic semiconductor component in which optoelectronic semiconductor chips are arranged on a top side of a carrier. A mold body is formed around the optoelectronic semiconductor chips and the mold body covers all lateral surfaces of the optoelectronic semiconductor chips. Preferably, the top and bottom sides of the optoelectronic semiconductor chips remain uncovered. After removing the carrier, the optoelectronic semiconductor chips may be singularized. Contact points may be provided at the top and/or bottom sides of each semiconductor chip. The mold body may e.g. be made of a molding material based on epoxy.

DE 10 2012 212 963.4 which has disclosure similar to that herein, the priority of which is claimed herein, also describes an optoelectronic semiconductor component as well as methods of producing an optoelectronic semiconductor component.

It could nonetheless be helpful to provide an optoelectronic semiconductor component with a reflective surface and a method of producing an optoelectronic semiconductor component having a reflective surface.

SUMMARY

We provide an optoelectronic semiconductor component including an optoelectronic semiconductor chip having a first surface, wherein the first surface is a radiation emission surface of the optoelectronic semiconductor chip, the semiconductor chip is embedded in a mold body, the first surface is elevated with respect to a top side of the mold body, and a reflective layer is arranged on the top side of the mold body.

We also provide a method of producing an optoelectronic semiconductor component including arranging a second surface of an optoelectronic semiconductor chip on a carrier; impressing a first surface of the semiconductor chip into a first foil by a depth of 10 μm to 100 μm; injecting a mold material between the first foil and the carrier to embed the semiconductor chip with a top side formed at a first foil in a mold body made of the mold material; and arranging a reflective layer on the top side of the mold body.

We further provide a method of producing an optoelectronic semiconductor component including arranging a first surface of an optoelectronic semiconductor chip on a carrier; casting a material from a matrix in which dispersive particles are embedded around the semiconductor chip; and arranging a first foil at a second surface of the semiconductor chip; injecting a mold material between the silicone and the first foil to embed the semiconductor chip in a mold body made of the mold material.

LIST OF REFERENCE NUMERALS 10 optoelectronic semiconductor component
20 optoelectronic semiconductor component
30 optoelectronic semiconductor component
40 optoelectronic semiconductor component
100 optoelectronic semiconductor chip
101 first surface
102 second surface
103 lateral surface
104 parting agent
110 substrate
120 epitaxic layer
130 mold body
131 top side
135 edge
136 edge height
140 luminescent layer
150 reflective layer
160 sacrificial layer
170 reflective layer
171 part deposited on mold body
172 part deposited on sacrificial layer
180 reflective layer
181 layer thickness
182 large contact angle
183 trench
185 reflective layer
186 small contact angle
187 edge
190 mold body
191 top side
192 edge
195 mold body
196 top side
197 trench
200 molding tool
210 carrier/lower tool element
220 upper tool element
230 first foil
231 foil thickness
240 second foil 250 filling space
255 trench
256 trench depth
260 first foil
270 second foil

DETAILED DESCRIPTION

Our optoelectronic semiconductor component comprises an opto-electronic semiconductor chip having a first surface. The semiconductor chip is embedded in a mold body. The first surface is elevated with respect to a top side of the mold body. A reflective layer is arranged on the top side of the mold body. Advantageously, the reflective layer on the top side of the mold body increases reflectivity of the optoelectronic semiconductor component, whereby e.g. a light efficiency of the optoelectronic semiconductor component may be increased as well. Advantageously, the reflective layer arranged on the top side of the mold body enables configuring the mold body itself of a non-reflective material. This advantageously enables configuring the mold body of conventional black mold materials based on epoxy which comprise a thermal expansion coefficient well-suited for this purpose and which are available at a low price.

The first surface may be formed by a surface of an epitaxy layer of the semiconductor chip. The first surface may then e.g. be a light-emitting radiation emission surface of the semiconductor chip. Advantageously, the reflective layer is then arranged on the same side of the optoelectronic semiconductor component as the radiation emission surface. Advantageously, the reflective layer may then anew reflect light that has been emitted by the radiation emission surface and back-reflected to the surface of the optoelectronic semiconductor component, the achievable effective luminous flux of the optoelectronic semiconductor component thus being increased.

The first surface may be elevated above the top side of the mold body by 10 µm to 100 µm. Advantageously, the reflective layer may then be configured sufficiently thick to achieve a high reflectivity.

The reflective layer may comprise silicone filled with titanium dioxide. Advantageously, silicone filled with titanium dioxide is available at a low price, may easily be processed and comprises a sufficient reflectivity.

A luminescent layer or a glass plate may be arranged on the first surface. Advantageously, the luminescent layer may then be used for light conversion. The glass plate may advantageously serve for light shaping.

The reflective layer may comprise a metal. The metal may e.g. be silver. Advantageously, metals such as silver comprise a particularly high reflectivity which allows for a very thin configuration of the reflective layer.

In an area directly abutting the semiconductor chip, the mold body may comprise a higher thickness than in remaining areas of the mold body. Advantageously, the semiconductor chip is then embedded in the mold body in a particularly stable manner.

A method of producing an optoelectronic semiconductor component comprises arranging a second surface of an opto-electronic semiconductor chip on a carrier, impressing a first surface of the semiconductor chip into a first foil by a depth of 10 µm to 100 µm, injecting a mold material between the first foil and the carrier to embed the semiconductor chip in a mold body formed of the mold material with a top side formed on the first foil, and arranging a reflective layer on the top side of the mold body. Advantageously, the optoelectronic semiconductor component produced by this method comprises a reflective top side, whereby e.g. a luminous efficiency to be achieved with the optoelectronic semiconductor component may be increased. In the process, a conventional black mold material based on epoxy may advantageously be used as mold material. Such mold materials are available at a low price and comprise thermal expansion coefficients optimally-suited to conduct the method. The lacking reflectivity of the mold material is thereby advantageously compensated for by arranging the reflective layer on the top side of the mold body. A further advantage of the method is that by impressing the first surface of the semiconductor chip into the first foil, a trench is formed around the semiconductor chip in a self-adjusting manner which leads to formation of an edge of the mold body encompassing the semiconductor chip. The semiconductor chip is thus held in the mold body in a stable manner and is still at the same time elevated above the parts of the top side of the mold body surrounding the edge. Thus, space is left on the top side of the mold body to arrange the reflective layer. The described self-adjustment advantageously allows for a simple and cost-efficient implementation of the method. A further advantage is that the method may essentially be implemented using conventional tools.

The first foil may comprise a thickness of at least 150 µm. Advantageously, the use of a first foil with the minimum thickness enables a sufficiently deep impressing of the first surface of the semiconductor chip into the first foil, thus a sufficiently deep trench being formed around the semiconductor chip in a self-adjusting manner.

The reflective layer may be formed by silicone filled with titanium dioxide arranged on the top side of the mold body. Advantageously, arranging the silicone filled with titanium dioxide may be carried out in a simple and cost-efficient manner.

Alternatively, a sacrificial layer is arranged on the first surface of the semiconductor chip before the first surface is impressed into the first foil. After producing the mold body, the reflective layer is deposited on the top side of the mold body and on the sacrificial layer. Subsequently, the sacrificial layer and the reflective layer deposited on the sacrificial layer are removed. Advantageously, the reflective layer then remains only on the top side of the mold body. In this variant, the reflective layer may be made of a metal such as silver, which advantageously results in a particularly high reflectivity. The method has the advantage that no photolithographic processes are required to apply the reflective layer. The sacrificial layer may advantageously be applied on the first surface of the semiconductor chip even before singularizing the semiconductor chip that is in the wafer composite, whereby the method may be carried out in a simple and cost-efficient manner.

A further of producing an optoelectronic semiconductor component comprises arranging a first surface of an optoelectronic semiconductor chip on a carrier, casting a material from a matrix in which dispersive particles are embedded around the semiconductor chip, arranging a first foil on a second surface of the semiconductor chip and injecting a mold material between the silicone and the first foil to embed the semiconductor chip in a mold body formed of the mold material. Advantageously, the method also enables production of an optoelectronic semiconductor component having a reflective surface, whereby e.g. a light efficiency of the optoelectronic semiconductor component is increased. Advantageously, the reflective surface is thereby produced in a self-adjusting manner, whereby the method may be implemented in a cost-efficient manner. In particular, no photolithographic process steps are required in the process. Thus, inaccuracies in arranging the semiconductor chips on the carrier advantageously do not result in inaccuracies in production of the reflective surface of the optoelectronic semiconductor component, thus advantageously not resulting in areas with a reduced reflectivity, either.

A lateral surface of the semiconductor chip may be coated with a parting agent before casting the material around the semiconductor chip. Advantageously, the parting agent arranged on the lateral surface of the semiconductor chip prevents excessive wetting of the lateral surface with the material, whereby a large contact angle forms between the material and the semiconductor chip. Thereby, sufficient space is left at the lateral surface of the semiconductor chip to achieve a large contact surface between the mold body made of the mold material and the semiconductor chip. This advantageously results in an optoelectronic semiconductor component having a high mechanical strength.

A foil made of ethylene tetrafluoroethylene (ETFE) may be used as a first foil. Advantageously, the first foil then has a non-adhesive function.

The first surface may be formed by a surface of an epitaxy layer of the semiconductor chip. Advantageously, the first surface may then be a light-emitting radiation emission surface of the semiconductor chip. Advantageously, the reflective layer is then arranged in the vicinity of the light-emitting radiation emission surface of the semiconductor chip, whereby the reflective layer may anew reflect light that has been emitted by the optoelectronic semiconductor component and reflected back to the top side of the optoelectronic semiconductor component, increasing the luminous flux maximally to be achieved by the optoelectronic semiconductor component.

A plurality of optoelectronic semiconductor chips may be arranged on the carrier. Advantageously, several semiconductor components may then simultaneously be produced as a composite, whereby production costs per optoelectronic semiconductor component are reduced significantly. Due to the self-adjusting character of the methods of producing the optoelectronic semiconductor component, tolerances in the arrangement of the optoelectronic semiconductor chips on the carrier advantageously do not reduce the accuracy of the orientation of the reflective layers with respect to the first surfaces of the semiconductor chips.

The above-described properties, features and advantages as well as the manner in which they are achieved will be explained more clearly and distinctly in connection with the following description of the examples which will be explained in more detail in conjunction with the drawings.

Figure 1:
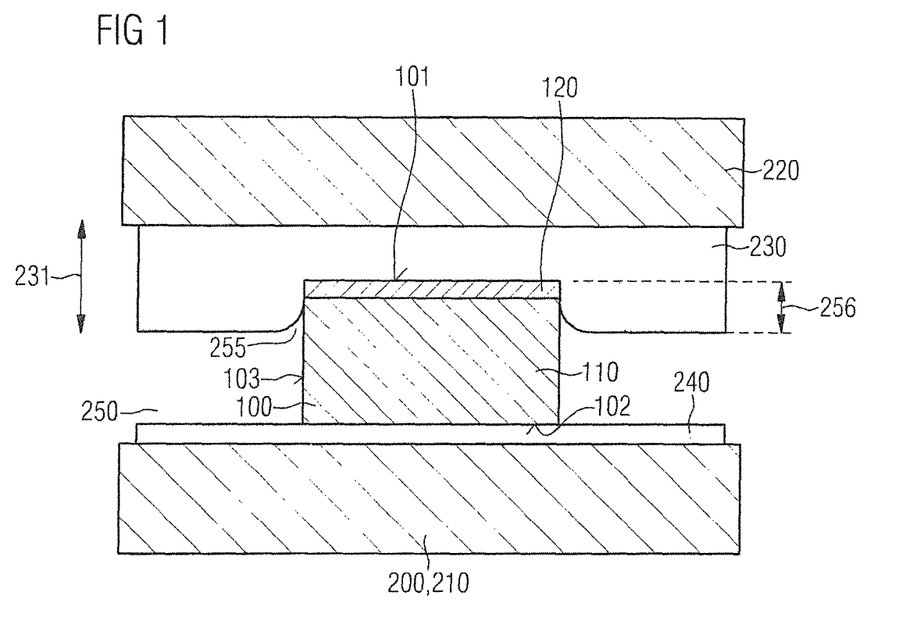
FIG. 1 shows a section through an optoelectronic semiconductor chip arranged in a molding tool.

FIG. 1 shows a section through an optoelectronic semiconductor chip 100 in a highly schematized depiction, the optoelectronic semiconductor chip 100 being arranged in a molding tool 200. The optoelectronic semiconductor chip 100 may e.g. be an LED chip configured as thin-film chip. The optoelectronic semiconductor chip 100 comprises a substrate 110 and an epitaxially grown light-emitting layer 120 which is referred to as "epitaxic layer 120," arranged on a surface of the substrate 110. The substrate 110 is preferably a substrate made of a semiconductor material. The epitaxic layer 120 has preferably only been arranged on the substrate 110 after it has been produced. The epitaxic layer 120 may e.g. comprise a thickness of 5 µm.

A surface of the epitaxic layer 120 facing away from the substrate 110 forms a first surface 101 of the optoelectronic semiconductor chip 100. A surface of the substrate 110 facing away from the epitaxic layer 120 forms a second surface 102 of the optoelectronic semiconductor chip 100 being arranged opposite to the first surface 101. In examples in which the optoelectronic semiconductor chip 100 is an LED chip, the first surface 101 of the optoelectronic semiconductor chip 100 preferably is a radiation emission surface of the optoelectronic semiconductor chip 100 through which light generated in the epitaxic layer 120 is emitted. Apart from the first surface 101 and the second surface 102, the optoelectronic semiconductor chip 100 altogether comprises four lateral surfaces 103.

The molding tool 200 comprises a lower tool element 210 and an upper tool element 220. The lower tool element 210 may also be referred to as carrier 210. The molding tool 200 essentially corresponds to conventional molding tools for foil-assisted transfer molding.

A first foil 230 is arranged on the surface of the upper tool element 220 facing the optoelectronic semiconductor chip 100. The first foil 230 is a particularly soft and thick foil. The first foil 230 comprises a foil thickness 231 of at least 150 µm. Preferably the first foil 230 comprises a foil thickness 231 of 200 µm. However, the first foil 230 may also be thicker. For example, the first foil 230 may be an ethylene tetrafluoroethylene foil (ETFE foil). Advantageously, the first foil 230 then comprises a Teflon-like non-adhesive function.

A second foil 240 is arranged on the carrier 210. The second foil 240 is preferably thinner and harder than the first foil 230. The second foil 240 may be configured in an adhesive manner on both sides. Thereby, a heat-dissolvable adhesive may be used. For example, the second foil 240 may be a Nitto-Denko-Revalpha foil.

The optoelectronic semiconductor chip 100 has at first been disposed on the second foil 240 arranged on the carrier 210 with its second surface 102. Subsequently, the upper tool element 220 of the molding tool 200 has been closed over the optoelectronic semiconductor chip 100 such that the first surface 101 of the optoelectronic semiconductor chip 100 has been impressed into the first foil 230 arranged at the upper tool element 220. The thick and soft first foil 230 has been strongly deformed in the process. By impressing the first surface 101 of the optoelectronic semiconductor chip 100 into the first foil 230 and the deformation of the first foil 230 resulting therefrom, a trench 255 has formed around the first surface 101 of the optoelectronic semiconductor chip 100 between the optoelectronic semiconductor chip 100 and the first foil 230. The trench 255 extends from the first surface 101 of the optoelectronic semiconductor chip 100 along the lateral surfaces 103 of the optoelectronic semiconductor chip 100 in the direction of the second surface 102 of the optoelectronic semiconductor chip 100 and comprises a trench depth 256. The trench depth 256 may be 10 µm to 100 µm depending on the hardness and the foil thickness 231 of the first foil 230. The trench depth 256 may also be still higher. Preferably, the trench depth 256 is 10 µm to 50 µm. Due to the deformation of the first foil 230, the trench 255 increasingly expands with increasing distance from the first surface 101 of the optoelectronic semiconductor chip 100. The first foil 230 can, however, also be softly configured such that the trench 255 is very narrow over its entire height, i.e. that the first foil 230 directly abuts against the lateral surfaces 103 of the optoelectronic semiconductor chip 100.

Preferably, the molding tool 200 comprises considerably larger lateral dimensions than the optoelectronic semiconductor chip 100. Thus, the lateral dimensions of the carrier 210, of the upper tool element 220, of the first foil 230 and of the second foil 240 are considerably larger than the first surface 101 and the second surface 102 of the optoelectronic semiconductor chip 100. Then, a plurality of further similar optoelectronic semiconductor chips 100 may be arranged between the first foil 230 and the second foil 240 simultaneously with the optoelectronic semiconductor chip 100.

Thereby, the optoelectronic semiconductor chips 100 are preferably arranged at a distance from each other in a regular pattern or grid. Advantageously, the efforts with respect to the accuracy of arranging the optoelectronic semiconductor chips 100 do not have to be very high. A filling space 250 remains in the vicinity of the lateral surfaces 103 of each optoelectronic semiconductor chip 100 between the individual optoelectronic semiconductor chips 100.

The filling space 250 surrounding the optoelectronic semiconductor chip 100 is filled with a mold material in a subsequent process step, e.g. by molding the mold material. The mold material may be a conventional mold material based on epoxy. In particular, a conventional black mold material may be used the thermal expansion coefficient of which is controlled for the use of foil-assisted transfer molding. The mold material completely fills up the filling space 250 including the trench 255 and forms a mold body enclosing the lateral surfaces 103 of the optoelectronic semiconductor chip 100. If multiple optoelectronic semiconductor chips are arranged in the molding tool 200, these are embedded in a common mold body and may be separated from one another in a subsequent process step.

Figure 2:
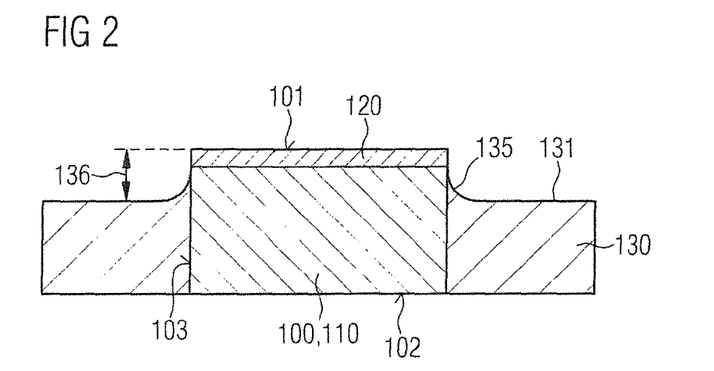
FIG. 2 depicts an optoelectronic semiconductor component according to a first example in a first processing state.

FIG. 2 shows a section through the optoelectronic semiconductor chip 100 after its removal from the molding tool 200 in a schematized depiction. The optoelectronic semiconductor chip 100 is embedded in a mold body 130 formed of the mold material. The mold body 130 comprises a top side 131 aligned in parallel to the first surface 101 of the optoelectronic semiconductor chip 100 and in the same spatial direction as the first surface 101. Since the first surface 101 has been impressed into the first foil 230 in the molding tool 200, the first surface 101 of the optoelectronic semiconductor chip 100 is elevated by an edge height 136 with respect to the top side 131 of the mold body 130. The edge height 136 thereby corresponds to the trench depth 256. The edge height 136 thus corresponds to the depth by which the first surface 101 of the optoelectronic semiconductor chip 100 has been impressed into the first foil 230. For example, the edge height 136 may be 10 μm to 100 μm, preferably 10 μm to 50 μm.

In the areas of the lateral surfaces 103 of the optoelectronic semiconductor chip 100 abutting on the first surface 101 of the optoelectronic semiconductor chip 100, an edge 135 of the mold body 130 is formed that extends almost or completely up to the first surface 101 of the optoelectronic semiconductor chip 100. The edge 135 is formed at the place at which the trench 255 had formed when impressing the first surface 101 of the optoelectronic semiconductor chip 100 into the first foil 230. Thus, the lateral surfaces 103 are completely or almost completely covered by the material of the mold body 130, thus resulting in a mechanically stable embedding of the optoelectronic semiconductor chip 100 in the mold body 130. When using a particularly soft first foil 230, the trench 255 may, however, also be narrowly configured such that no or almost no edge 135 is formed.

Figure 3:
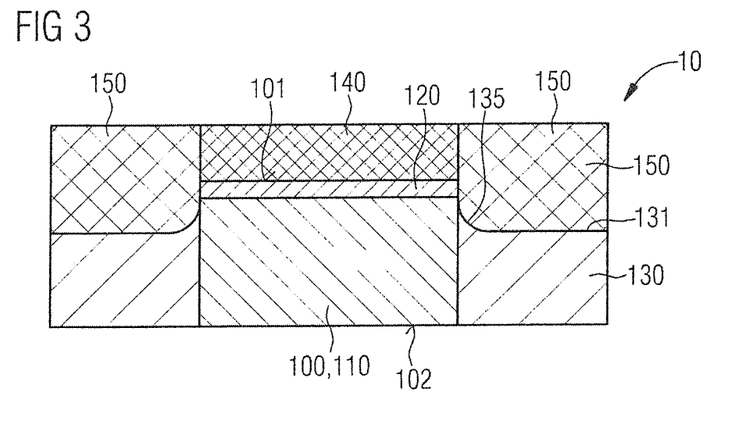
FIG. 3 shows the optoelectronic semiconductor component of the first example in a second processing state.

FIG. 3 shows in a schematized depiction a further section through the optoelectronic semiconductor chip 100 after a further processing step. By the now completed processing, an optoelectronic semiconductor component 10 according to a first example has been formed.

Compared to the processing state shown in FIG. 2, a luminescent layer 140 has first of all been disposed on the first surface 101 of the optoelectronic semiconductor chip 100. The luminescent layer 140 may e.g. comprise phosphorus and serve for the wavelength conversion of a radiation emitted by the optoelectronic semiconductor chip 100. Instead of the luminescent layer 140, a glass plate could also have been arranged on the first surface 101 of the optoelectronic semiconductor chip 100. The glass plate could e.g. serve for light shaping of a radiation emitted by the optoelectronic semiconductor chip 100. However, the luminescent layer 140 could also have been omitted without substitution.

After disposing the luminescent layer 140 on the first surface 101 of the optoelectronic semiconductor chip 100, the space arranged above the top side 131 of the mold body 130 and laterally beside the luminescent layer 140 has been cast or molded with a reflective layer 150. The reflective layer 150 preferably consists of a silicone filled with titanium dioxide. For example, the reflective layer 150 may consist of silicone with a low refractive index having a percentage of weight of 25 percent to 35 percent of titanium dioxide. However, the reflective layer may also consist of silicone filled with another dispersive material than titanium dioxide, e.g. with aluminum dioxide or zirconium oxide. Also, it is possible to use another matrix than silicone. For example, an epoxy may be used. The thickness of the reflective layer 150 corresponds to the sum of the edge height 136 by which the first surface 101 of the optoelectronic semiconductor chip 100 is elevated above the top side 131 of the mold body 130 and to the thickness of the luminescent layer 140. In a simplified embodiment, the luminescent layer 140 may be omitted. In this case, the thickness of the reflective layer 150 only corresponds to the edge height 136.

If a plurality of optoelectronic semiconductor chips 100 has been arranged in the molding tool 200 and embedded in a common mold body 130, the intermediate spaces above the top side 131 of the mold body 130 and between the luminescent layers 140 arranged between the first surfaces 101 of the optoelectronic semiconductor chips 100 have simultaneously been filled up with the reflective layer 150. Subsequently, the individual optoelectronic semiconductor chips 100 have been singularized with respectively a part of the mold body 130 surrounding them and the reflective layer 150.

In examples in which the optoelectronic semiconductor chip 100 is an LED chip the first surface 101 of which forms a radiation emission surface, a part of the radiation emitted through the first surface 101 may be reflected back in the direction of the optoelectronic semiconductor component 10 by other components in the vicinity of the optoelectronic semiconductor component 10. Advantageously, in the optoelectronic semiconductor component 10, the radiation is reflected anew by the reflective layer 150 and thus again emitted through the optoelectronic semiconductor component 10. Hereby, absorbance and loss of the back-reflected radiation is prevented by the black mold body 130. Advantageously, the total amount of the radiation emitted and used by the optoelectronic semiconductor component 10 is increased by this and thus also the efficiency of the optoelectronic semiconductor component 10.

The described method of producing the optoelectronic semiconductor component 10 offers the advantage that it may be implemented without major adaptations by conventional tools. In particular, the molding tool 200 itself may essentially be known. The described advantages of the method essentially result from the use of the thick and soft first foil 230 at the upper tool element 220 of the molding tool 200.

Figure 4:
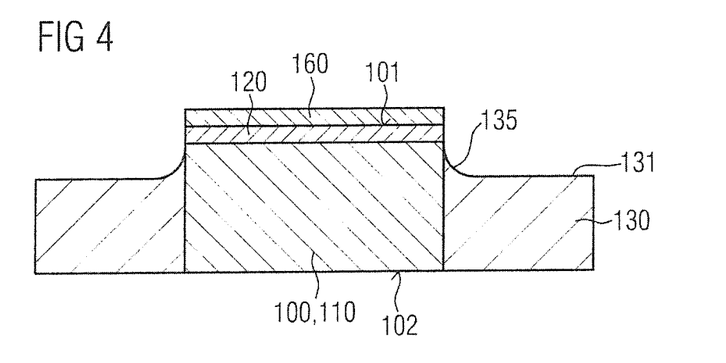
FIG. 4 shows a section through an optoelectronic semiconductor component according to a second example in a first processing state.

FIG. 4 in a schematized depiction shows a section through a still unfinished semiconductor component according to a second example produced according to a variant of the described method. In the following, the same reference numerals as in FIGS. 1 to 3 will be used for identical components or those having the same effects.

FIG. 4 depicts an optoelectronic semiconductor chip 100 corresponding to that of FIGS. 1 to 3. Additionally, a sacrificial layer 160 is arranged on the first surface 101 of the optoelectronic semiconductor chip 100 of FIG. 4. Preferably, the sacrificial layer 160 has been applied directly after producing the optoelectronic semiconductor chip 100 in a wafer composite prior to singularizing the optoelectronic semiconductor chip 100. The sacrificial layer 160 may e.g. be a photoresist suitable for a lift-off process. The sacrificial layer 160 may then have been disposed on the first surface 101 of the optoelectronic semiconductor chip 100 e.g. by spin-coating.

As explained on the basis of FIGS. 1 and 2, the optoelectronic semiconductor chip 100 with the sacrificial layer arranged on the first surface 101 has subsequently been arranged in the molding tool 200, wherein the first surface 101 with the sacrificial layer 160 arranged on it has been impressed into the first foil 230. Then, the optoelectronic semiconductor chip 100 has, analogous to the depiction of FIG. 2, been embedded in the mold body 130.

Figure 5:
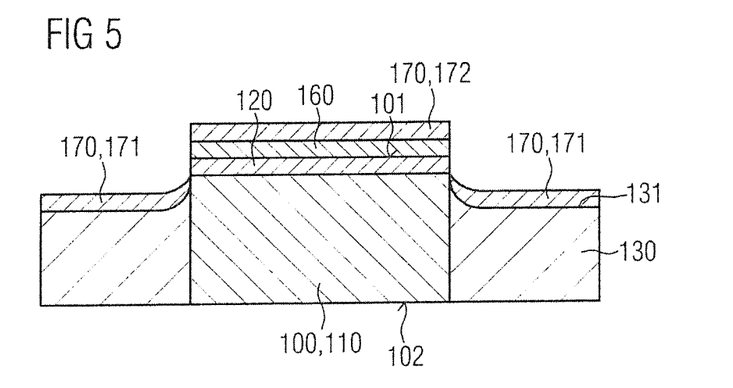
FIG. 5 depicts a section through the optoelectronic semiconductor component of the second example in a second processing state.

FIG. 5 shows a section through the optoelectronic semiconductor chip 100 of FIG. 4 after a further processing step. A reflective layer 170 has been deposited on the sacrificial layer 160 and on the top side 131 of the mold body 130. The reflective layer 170 preferably consists of a metal, e.g. of silver. The reflective layer 170 may e.g. have been deposited by vapor deposition or sputtering. In this process, a part 171 of the reflective layer 170 has arranged on the top side 131 of the mold body 130 and a further part 172 of the reflective layer 170 has arranged on the sacrificial layer 160. Since the reflective layer 170 may consist of a metal having a high reflectivity, the reflective layer 170 may be configured as a very thin layer.

Figure 6:
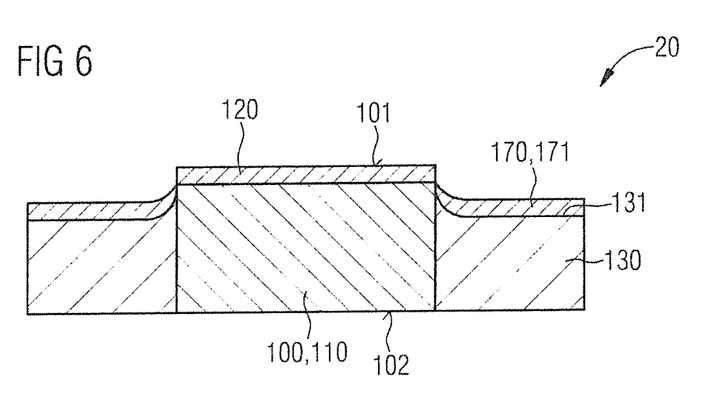
FIG. 6 depicts a section through the optoelectronic semiconductor component of the second example in a third processing state.

FIG. 6 shows an optoelectronic semiconductor component 20 according to a second example that has developed by further processing the optoelectronic semiconductor chip 100 of FIG. 5. Thereby, the sacrificial layer 160 and the part 172 of the reflective layer 170 deposited on the sacrificial layer 160 have been removed by a stripping technique. If the sacrificial layer 160 has been a photoresist, the sacrificial layer 160 may e.g. have been removed by a lift-off process. Lifting-off the sacrificial layer 160 has been allowed for by the fact that the first surface 101 of the optoelectronic semiconductor chip 100 is elevated above the top side 131 of the mold body 130. As a result, it has been possible to access the sacrificial layer 160 from the side and it could be affected e.g. by a solvent.

As a result of lifting-off the sacrificial layer 160 and the part 172 of the reflective layer 170 deposited on the sacrificial layer 160, the first surface 101 of the optoelectronic semiconductor chip 100 is now exposed. The part 171 of the reflective layer 170 remains on the top side 131 of the mold body 130.

By the described method, the reflective layer 170 has advantageously been arranged on the mold body 130 without using a photolithographic technique. Advantageously, the reflective layer 170 is thus limited in the orientation to the top side 131 of the mold body 130 without high efforts and with a high accuracy.

Figure 7:
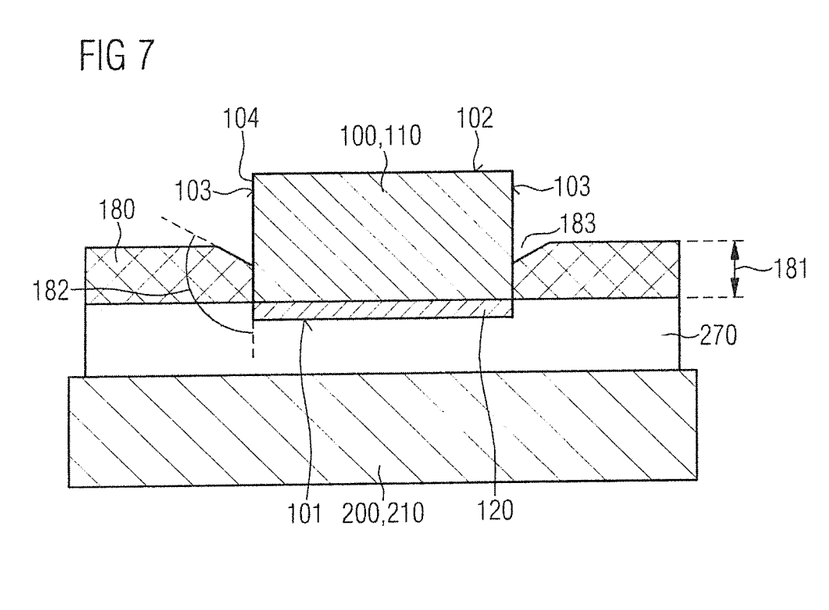
FIG. 7 shows a section through the optoelectronic semiconductor component according to a third example.

FIG. 7 shows a section through an optoelectronic semiconductor chip 100 during the production of an optoelectronic semiconductor component according to a third example according to a further variant of the described method. Again, the same reference numerals as in the previous description will be used for identical components or those having the same effects.

In this variant, a second foil 270 is arranged on the carrier 210 of the molding tool 200. The second foil 270 may e.g. be a foil being adhesive on both sides such as a Nitto-Denko-Revalpha foil. The optoelectronic semiconductor chip 100 is arranged on the second foil 270 on the lower tool element 210 of the molding tool 200 such that the first surface 101 of the optoelectronic semiconductor chip 100 faces the second foil 270. Again, several optoelectronic semiconductor chips 100 are preferably arranged on the second foil 270 at a distance from each other in a regular pattern.

The lateral surfaces 103 of the optoelectronic semiconductor chip 100 are coated with a parting agent 104. The parting agent 104 may e.g. be Teflon. The parting agent 104 may e.g. have been deposited on the lateral surfaces 103 of the optoelectronic semiconductor chip 100 in a plasma process prior to arranging the optoelectronic semiconductor chip 100 on the second foil 270 of the molding tool 200. During the plasma process, the first surface 101 and the second surface 102 of the optoelectronic semiconductor chip 100 have preferably been covered or protected in another manner.

After placing the optoelectronic semiconductor chip 100 on the second foil 270, the area around the optoelectronic semiconductor chip 100 or, respectively, the area between the several optoelectronic semiconductor chips 100 has been filled up with a reflective material in order to form a reflective layer 180 having a layer thickness 181. The reflective material may e.g. be silicone filled with titanium dioxide. For example, the reflective layer 180 may consist of silicone with a low refractive index having a percentage of weight of 25 percent to 35 percent of titanium dioxide. Again, however, another matrix and other dispersive particles may be used, as well. The filling-up may e.g. have been implemented by casting. The layer thickness 181 may e.g. be 10 μm to 100 μm, preferably 10 μm to 50 μm.

Due to the parting agent 104 arranged on the lateral surfaces 103 of the optoelectronic semiconductor chip 100, the reflective layer 180 does not strongly wet the lateral surfaces 103 of the optoelectronic semiconductor chip 100. Thereby, in the transition area between the reflective layer 180 and the lateral surfaces 103 of the optoelectronic semiconductor chip 100, a large contact angle 182 of more than 90° has developed. As a result thereof, a trench 183 is circumferentially formed in the reflective layer 180 around the optoelectronic semiconductor chip 100 in the transition area between the lateral surfaces 103 and the reflective layer 180. Thus, in the direct vicinity of the lateral surface 103 of the optoelectronic semiconductor chip 100, the reflective layer 180 comprises a thickness that is a bit smaller than the layer thickness 181 in the areas of the reflective layer 180 further away from the lateral surfaces 103.

Figure 8:
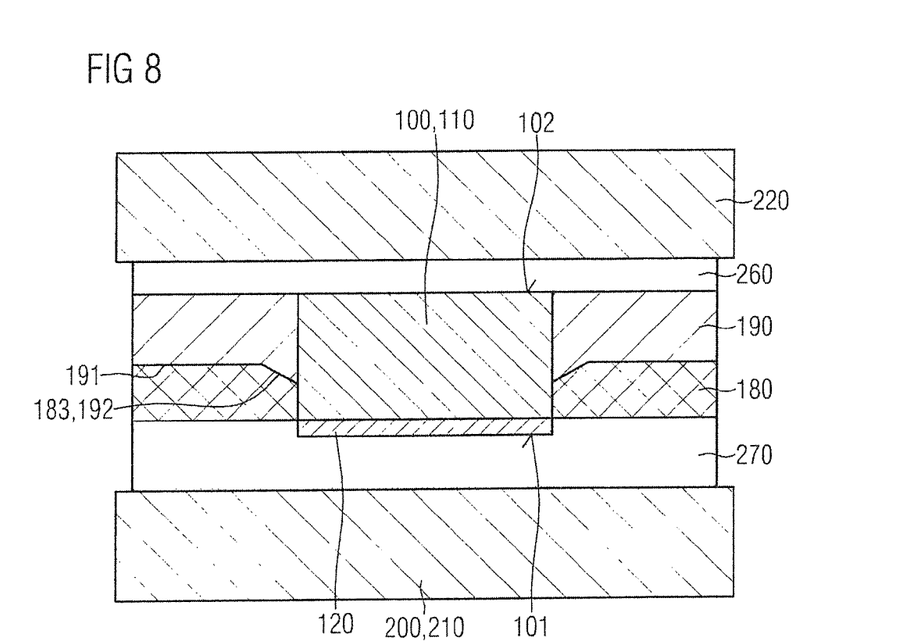
FIG. 8 shows a section through the optoelectronic semiconductor component according to the third example arranged in a molding tool in a further processing state.

FIG. 8 depicts a section through the optoelectronic semiconductor chip 100 of FIG. 7 subsequent to further processing steps. In this context, the upper tool element 220 of the molding tool 200 has first of all been closed over the optoelectronic semiconductor chip 100. At the upper tool element 220, a first foil 260 is arranged. The first foil 260 may e.g. be an ETFE foil having a non-adhesive function. The first foil 260 of FIG. 8 is, however, not configured as thickly and softly as the first foil 230 of FIG. 1. Consequently, the second surface 102 does not or hardly impress into the first foil 260 arranged at the upper tool element 220.

Subsequently, the space remaining between the reflective layer 180 and the first foil 260 in the vicinity of the optoelectronic semiconductor chip 100 or, respectively, the space remaining between the plurality of optoelectronic semiconductor chips 100, has been filled up by injecting a filling material to form a mold body 190. In this context, the filling material has preferably been injected by means of a foil-assisted transfer molding. The filling material may again be a known black mold material based on epoxy.

The formed mold body 190 comprises a top side 191 that abuts on the reflective layer 180. In the area of the trench 183 formed in the reflective layer 180, the mold body 190 comprises an edge 192, the mold body 190 thus comprising a higher thickness in the areas abutting on the lateral surfaces 103 of the optoelectronic semiconductor chip 100 than in areas that are further away from the lateral surfaces 103. Thus, the mold body 190 is in contact with large sections of the lateral surfaces 103, the optoelectronic semiconductor chip 100 thus being embedded in the mold body 190 in a mechanically stable manner.

Figure 9:
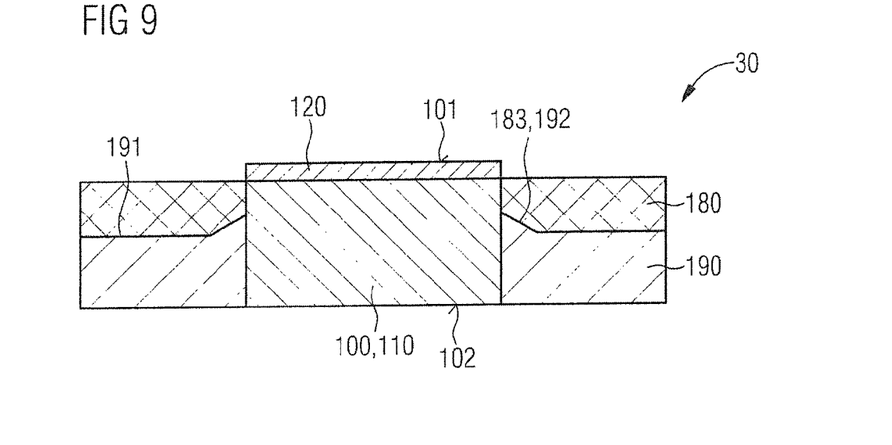
FIG. 9 depicts a section through the finished optoelectronic semiconductor component according to the third example.

FIG. 9 in a schematized depiction shows a section through an optoelectronic semiconductor component 30 according to a third example available after removing the upper tool element 220 and the carrier 210 of the molding tool 200. The optoelectronic semiconductor chip 100 of the optoelectronic semiconductor component 30 is embedded in the mold body 190. The first surface 101 of the optoelectronic semiconductor chip 100 is arranged in a co-planar manner with respect to the top side 191 of the mold body 190 and is oriented in the same spatial direction as the top side 191 of the mold body 190. The first surface 101 is elevated with respect to the top side 191 of the mold body 190. The reflective layer 180 is arranged on the top side 191 of the mold body 190.

In a further example, a luminescent layer may be arranged on the first surface 101 of the optoelectronic semiconductor chip 100 of the optoelectronic semiconductor component 30. The luminescent layer may e.g. comprise phosphorus and may serve for the wavelength conversion of a radiation emitted by the optoelectronic semiconductor chip 100. Instead of the luminescent layer, a glass plate may also be arranged on the first surface 101 of the optoelectronic semiconductor chip 100. The glass plate may e.g. serve for the light shaping of a radiation emitted by the optoelectronic semiconductor chip 100. Preferably, the luminescent layer or the glass plate is arranged on the first surface 101 of the optoelectronic semiconductor chip 100 even prior to arranging the optoelectronic semiconductor chip 100 on the second foil 270 on the carrier 210 of the molding tool 200.

Figure 10:
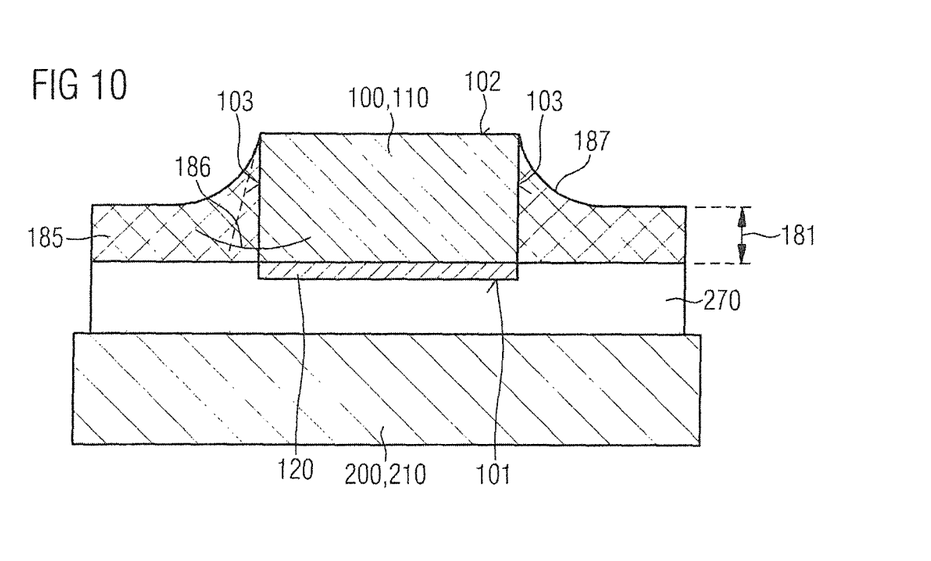
FIG. 10 depicts a section through an optoelectronic semiconductor component according to a fourth example in a first processing state.

FIG. 10 depicts a section through an optoelectronic semiconductor chip 100 during a production of an optoelectronic semiconductor component according to a further example. Thereby, the production is implemented according to a variant of the method explained on the basis of FIGS. 7 to 9. Again, identical components or those having the same effects have the same reference numerals.

In the depiction of FIG. 10, the optoelectronic semiconductor chip 100 is again arranged on the second foil 270 on the carrier 210 of the molding tool 200 with its first surface 101. However, compared to the method as explained on the basis of FIG. 7, the lateral surfaces 103 of the optoelectronic semiconductor chip 100 are now not coated with a parting agent. Again, the area surrounding the optoelectronic semiconductor chip or, respectively, the area between the plurality of optoelectronic semiconductor chips 100 has been filled-up with a reflective material having the layer thickness 181 starting from the second foil 270 in order to form a reflective layer 185. Again, the reflective material may preferably be silicone filled with titanium dioxide. For example, silicone having a 35 percent ratio of titanium dioxide may again be used. The layer thickness may again be 10 µm to 100 µm, preferably 10 µm to 50 µm. Again, however, another matrix and other dispersive particles may also be used. The filling-up may again preferably have been implemented by casting.

Since the lateral surfaces 103 of the optoelectronic semiconductor chip 100 in the variant of FIG. 10 are not coated with a parting agent, the reflective material has strongly wetted the lateral surfaces 103 of the optoelectronic semiconductor chip 100 and has crept upwards along the lateral surfaces 103. Due to this, a small contact angle 186 of less than 90° has developed in the transition area between the reflective layer 185 and the lateral surfaces 103 of the optoelectronic semiconductor chip 100. Thus, the reflective layer 185 in the direct vicinity of the lateral surfaces 103 of the optoelectronic semiconductor chip 100 comprises a layer thickness that is higher than the layer thickness 181 in the remaining areas of the reflecting layer 185. Abutting on the lateral surfaces 103, the reflective layer 185 comprises an edge 187.

In a subsequent processing step, the upper tool element 220 of the molding tool 200 with the first foil 260 arranged on it is again, analogous to FIG. 8, closed over the optoelectronic semiconductor chip 100. Then, the free space remaining between the reflective layer 185 and the first foil 260 is filled by injecting a mold material in order to form a mold body 195.

Figure 11:
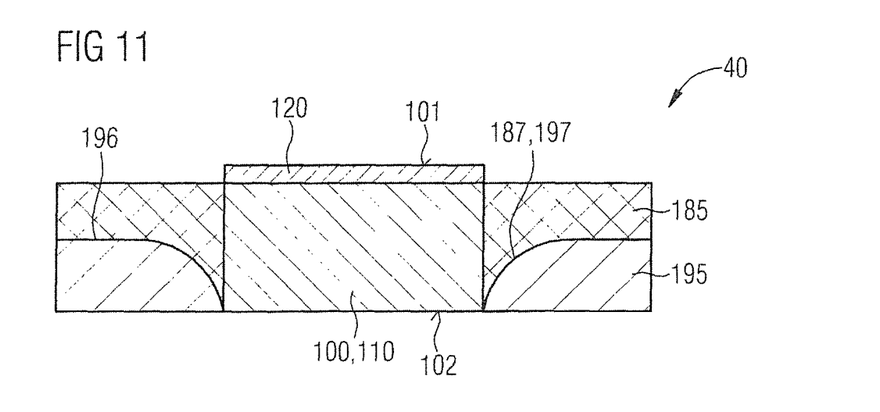
FIG. 11 depicts a further section through the optoelectronic semiconductor component of the fourth example in a further processing state.

FIG. 11 shows the resulting finished optoelectronic semiconductor component 40 according to a fourth embodiment after removal of the molding tool 200. The resulting mold body 195 comprises a top side 196 that abuts on the reflective layer 185. Abutting on the edge 187 formed at the reflective layer 185, the mold body 195 comprises a trench 197. Due to this, the mold body 195 at the optoelectronic semiconductor component 40 is in contact only with small parts of the lateral surfaces 103 of the optoelectronic semiconductor chip 100.

At the optoelectronic semiconductor component 40, the first surface 101 of the optoelectronic semiconductor chip 100 is elevated above the top side 196 of the mold body 195. In the area surrounding the first surface 101 of the optoelectronic semiconductor chip 100 of the optoelectronic semiconductor component 40, the reflective layer 185 is arranged on the mold body 195. Light emitted through the first surface 101 of the optoelectronic semiconductor chip 100 and reflected in the vicinity of the optoelectronic semiconductor component 40 is anew reflected by the reflective layer 185 in the direction in which the first surface 101 of the optoelectronic semiconductor chip 100 points. Hereby, the radiation reflected back to the optoelectronic semiconductor component 40 cannot be absorbed in the mold body 195, even if the mold body 195 comprises a black color.

In a variant of the method as described on the basis of FIGS. 10 and 11, a luminescent layer or a glass plate may also be arranged on the first surface 101 of the optoelectronic semiconductor chip 100. Preferably, the luminescent layer or the glass plate is arranged on the first surface 101 of the optoelectronic semiconductor chip 100 even prior to arranging the optoelectronic semiconductor chip 100 on the second foil 270 on the carrier 210 of the molding tool 200.

Our components and methods have been illustrated and described in detail on the basis of the preferred examples. However, this disclosure is not limited to the disclosed examples. Rather, other variations may be derived therefrom by those skilled in the art without exceeding the protective scope of the appended claims.

The invention claimed is:

1. A method of producing an optoelectronic semiconductor component comprising:
   arranging a second surface of an optoelectronic semiconductor chip on a carrier;
   impressing a first surface of the semiconductor chip into a first foil by a depth of 10 µm to 100 µm;
   injecting a mold material between the first foil and the carrier to embed the semiconductor chip with a top side formed at a first foil in a mold body made of the mold material; and
   arranging a reflective layer on the top side of the mold body.

2. The method according to claim 1, wherein the first foil has a thickness of at least 150 µm.

3. The method according to claim 1, wherein the reflective layer is formed of silicone filled with titanium dioxide arranged on the top side of the mold body.

4. The method according to claim 1, wherein:
- a sacrificial layer is arranged on the first surface of the semiconductor chip before the first surface is impressed into the first foil,
- the reflective layer is deposited on the top side of the mold body and on the sacrificial layer, and
- the sacrificial layer and the reflective layer deposited on the sacrificial layer are subsequently removed.

5. The method according to claim 1, wherein a foil made of ethylene tetrafluoroethylene is the first foil.

6. The method according to claim 1, wherein the first surface is formed by a surface of an epitaxy layer of the semiconductor chip.

7. The method according to claim 1, wherein a plurality of optoelectronic semiconductor chips is arranged on the carrier.

* * * * *